(12) United States Patent
Louwsma et al.

(10) Patent No.: US 7,687,812 B2
(45) Date of Patent: Mar. 30, 2010

(54) LIGHT-EMITTING DIODE ARRAYS AND METHODS OF MANUFACTURE

(75) Inventors: Hendrik Klaas Louwsma, Heerlen (NL); Pieter Goldhoorn, Veldhoven (NL); Hermans Jans, Landgraaf (NL)

(73) Assignee: TPO Displays Corp. (TW)

( * ) Notice: Subject to any disclaimer, the term of this patent is extended or adjusted under 35 U.S.C. 154(b) by 97 days.

(21) Appl. No.: 11/763,480

(22) Filed: Jun. 15, 2007

(65) Prior Publication Data

US 2008/0308820 A1    Dec. 18, 2008

(51) Int. Cl.
*H01L 33/00*    (2010.01)
(52) U.S. Cl. .................... 257/89; 257/88; 257/E25.02
(58) Field of Classification Search .......... 257/79–103, 257/E25.02
See application file for complete search history.

(56) References Cited

U.S. PATENT DOCUMENTS 5,583,351 A * 12/1996 Brown et al. ................. 257/89
6,639,249 B2 * 10/2003 Valliath ....................... 257/88
2007/0007542 A1 * 1/2007 Fujiwara ...................... 257/98

\* cited by examiner

*Primary Examiner*—David Vu
(74) *Attorney, Agent, or Firm*—Thomas, Kayden, Horstemeyer & Risley, LLP.

(57) ABSTRACT

A representative LED array includes: a base substrate (BS) and a plurality of light emitting diodes, each of the light emitting diodes comprising a stack of a first contact layer, a semiconductor stack and a second contact layer, the semiconductor stack being on top of the first contact layer, the second contact layer being on top of the semiconductor stack; the plurality of light emitting diodes being arranged in pixel matrix on the base substrate as LEDs of at least three types (R, G, B); the LEDs according to their type (R, G, B) being arranged as at least a first, second and third sub-pixel in the pixel matrix for emission of radiation of a respective specific at least first, second and third color; and interconnection circuitry on the substrate, operative to connect to the light emitting diodes of the array for addressing each of the light emitting diodes.

8 Claims, 4 Drawing Sheets

LIGHT-EMITTING DIODE ARRAYS AND METHODS OF MANUFACTURE

TECHNICAL FIELD

The present invention relates to light-emitting diode (LED) arrays and methods for manufacturing such arrays.

DESCRIPTION OF THE RELATED ART

Nowadays, many display types exist, from conventional CRT (cathode ray tube) displays used for television and monitor applications to AM (active matrix) LCD (liquid crystal display) displays for television, monitor and mobile phone applications. The AM LCD's are emerging rapidly due to their form factor. Thin film transistor (TFT) technology enables a pixel array plate that allows for flat panel systems. The front-of-screen performance (contrast, brightness, viewing angle, switching times, uniformity, color gamut) of LCD displays is nevertheless still inferior to that of conventional CRT displays. The main reason is that the CRT is an emissive display type whereas the LCD is transmissive, reflective or both (transflective).

Flat panel array plates can also used in AM OLED (organic light emitting diode) displays that are currently in development. AM OLFD displays are expected to give superior front-of-screen performance compared to AM OLED displays as AM OLED is an emissive display type too.

Niche markets are addressed by displays using electrophoresis, resulting in low power e-books with (often) static images. Very large screen displays, such as electronic billboards, may be made of arrays of LED elements, in which individual LED packages are placed on a carrier to form a display with very large pixel dimensions.

SUMMARY

An embodiment of an LED array comprises: a base substrate (BS) and a plurality of light emitting diodes, each of the light emitting diodes comprising a stack of a first contact layer, a semiconductor stack and a second contact layer, the semiconductor stack being on top of the first contact layer, the second contact layer being on top of the semiconductor stack; the plurality of light emitting diodes being arranged in pixel matrix on the base substrate as LEDs of at least three types (R, G, B); the LEDs according to their type (R, G, B) being arranged as at least a first, second and third sub-pixel in the pixel matrix for emission of radiation of a respective specific at least first, second and third color; and interconnection circuitry on the substrate, operative to connect to the light emitting diodes of the array for addressing each of the light emitting diodes.

An embodiment of a method for manufacturing an LED array comprises: providing a base substrate (BS); providing on the base substrate a plurality of light emitting diodes, each light emitting diode comprising a stack of a first contact layer, a semiconductor stack and a second contact layer; arranging the plurality of light emitting diodes in a pixel matrix on the base substrate as LEDs of at least three types (R, G, B); arranging the LEDs according to their type (R, G, B) as at least a first, second and third sub-pixel in the pixel matrix for emission of radiation of a respective specific at least first, second and third color; and providing interconnection circuitry on the substrate for connection to the light emitting diodes of the array for addressing each of the light emitting diodes.

BRIEF DESCRIPTION OF THE DRAWINGS

Below, the invention will be explained with reference to some drawings, which are intended for illustration purposes only and not to limit the scope of protection which is defined in the accompanying claims.

DETAILED DESCRIPTION

In an exemplary embodiment an LED array display is provided which is based on a base substrate BS for a plurality of LED elements that make up the LED array. Such an LED array display may comprise the required electrodes to drive the individual LED elements as (sub)pixels of the array. The LED elements are manufactured on the base substrate 1 by using deposition technology (technologies) and lithography.

Figure 1A:
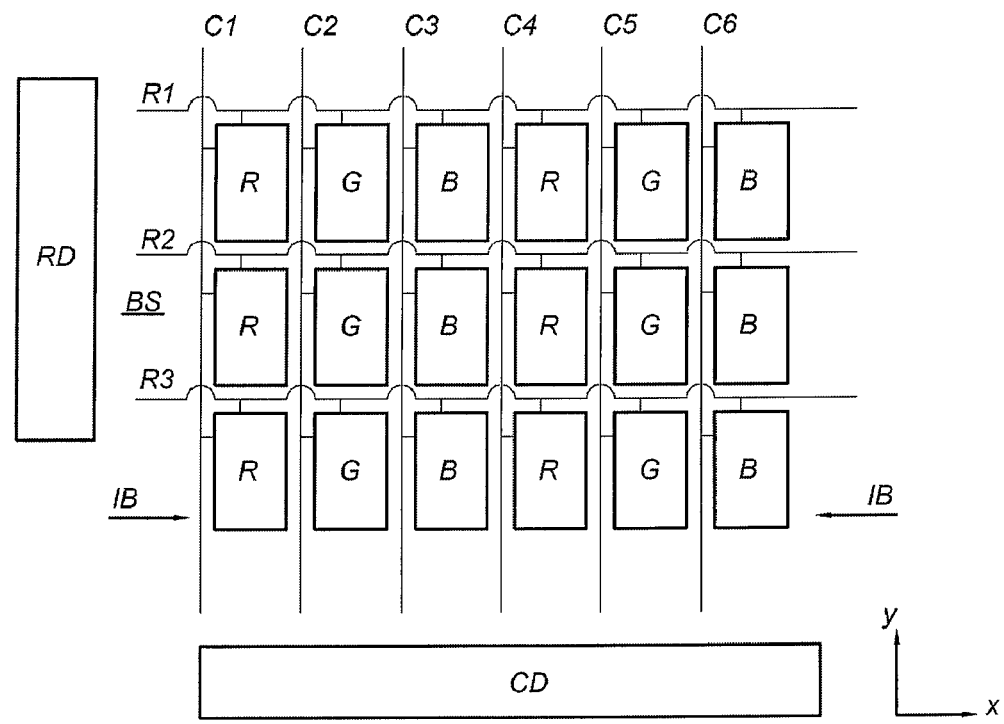
FIGS. 1a and 1b show a top view and a cross-section, respectively, of an exemplary layout of an embodiment of an LED array.
Figure 1B:
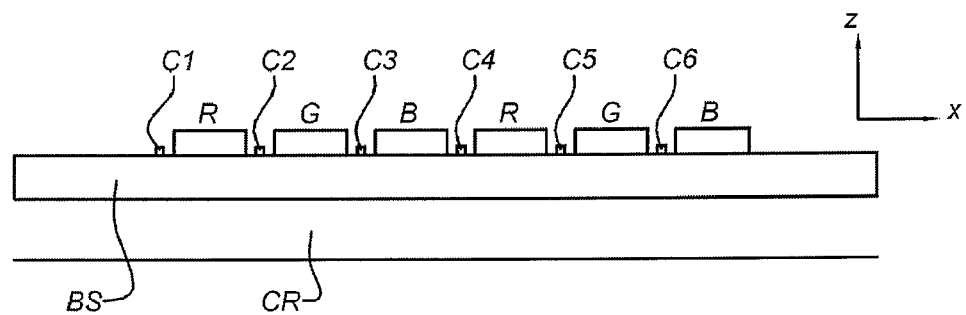

FIGS. 1a and 1b show a top view and a cross-section, respectively, of an exemplary layout of an embodiment of an LED array. Specifically, FIG. 1a shows the top view of an exemplary array of LED elements R, G, B in which LED elements of the same color are ordered as individual sub-pixels in stripes. Within a stripe each LED element is individually addressable. Note that for reason of clarity, the electronic circuit coupled to the LED elements is not shown in detail here.

The LED array, which comprises a plurality of light emitting diodes, is arranged in a pixel matrix. The pixel matrix comprises addressable pixels for forming an image. Each light emitting diode is a sub-pixel of one of the three color types R, G, B. The sub-pixels are grouped in a combination that comprises the three color types R, G, B as one pixel. In this exemplary case the ordering of the R, G, B sub-pixels is a so-called RGB stripe arrangement in which the sub-pixels extend as individual sub-pixels along stripes in a vertical direction Y. The LED elements R, G, B are located on a base substrate BS.

In FIG. 1a, a red LED element R is in the horizontal direction X adjacent to green LED element G. Green LED element G is next to blue element B. The sequence of R, G, B LED elements is repeated along the horizontal direction X.

On the substrate, interconnection wiring is provided that connects to the LED elements of the array. The LED elements of the array are each coupled with one terminal (not shown) to a first interconnection wire that extends as row line R1, R2, R3 in the horizontal direction X and with another terminal (not shown) to a second interconnection wire that extends as a column line C1, C2, C3, C4, C5, C6 in the vertical direction Y.

The row lines are connected to a row driving circuit RD and the column lines are connected to a column driving circuit CD. The row driving circuit RD and the column driving circuit CD are arranged for addressing each LED element in the array.

FIG. 1b shows the cross-section of the LED array along horizontal line IB-IB of FIG. 1a. As shown in FIG. 1b, each two adjacent LED elements R, G, B are separated from each other by one column line. The LED elements R, G, B are arranged directly on the base substrate BS, which will be explained in more detail below.

The base substrate BS may be a conductor, semiconductor or isolator, either organic or inorganic, either transparent to light or (partially) opaque. Advantageously, an embodiment of an LED array display may have a relatively low power consumption in comparison to AM LCD or AM OLED displays. As an illustration, a typical "low power" high brightness LED as used for LED backlights for mobile displays generates 50-75 Lm/W (Lumen per Watt). The naked die size of such a LED is 200×400 µm. Driven at 50 mW, the 50 Lm/W LED generates a luminous flux of 2.5 Lm. (For mobile phone applications, the typical observer distance is 35-50 cm.) The enclosed solid angle ω is given by:

$$\omega = \frac{S}{r^2}$$

in which $S=4\pi r^2$ is the surface of a sphere and r is the observer distance. Thus, $\omega=4\pi$. Note that this is a very conservative estimate as no recycling of the light emitted in the direction opposite to the observer is assumed.

The luminous flux of 2.5 Lm at this solid angle gives a luminous intensity of $2.5/\omega=0.2$ Cd. It is noted that the exemplary embodiments of LEDs as described here and equipped with DBR (distributed Bragg reflectors) may achieve a luminous intensity of 1.0 to 1.8 Cd.

Under the assumption that the LED emits light homogeneously across its die surface, i.e. the emitting area is $8 \cdot 10^{-8}$ $m^2$. Thus, a luminance of $2.5 \cdot 10^6$ $Cd/m^2$ for the naked LED die surface is obtained.

From the prior art, it is known that very bright mobile phone displays may have a luminance of 250 $Cd/m^2$. Typically, a display module (including backlight) with a luminance of 250 $Cd/m^2$ is likely to consume more than 200 mW of power. This luminance of 250 $Cd/m^2$ is $10^4$ times lower than the luminance of the above mentioned LED. Assuming that the light output of the LED is proportional to the LED current, which is true for small currents, an LED current and hence LED power can be used which is a factor $10^4$ times lower than 50 mW, i.e., a power of about 5 µW can be used (i.e., is sufficient) for a LED die with a size of 200×400 µm in order to achieve a luminance of 250 $Cd/m^2$ across the die size.

Now, a 2-inch qVGA (quarter VGA) display is considered. Such a display comprises 320×240 pixels. In many applications, its active area is approximately 30×40 mm. Within this active area, 15000 LEDs (=30×40/0.08) can fit with above described characteristics (neglecting the space of row and column electrodes/lines). Together these LED's consume a power of 75 mW (=15000×5 µW). It is quite a challenge to realize such a 2 inch qVGA display, by either AM OLED or AM LCD with backlight type, with a power consumption of only 75 mW.

Instead of 15000 LED dies of 200×400 µm, at least some embodiments use an LED array with RGB LED dice in the 2 inch qVGA area. Within the 2 inch qVGA array 320×240×3 (RGB)=230400 LED dies with a dimension of 41.6×125 µm can be fitted.

It can be concluded from the discussion above that the power consumption of such a LED array is far lower than that of conventional AM OLED and AM LCD displays, when comparing them at a given display luminance. It is noted that similar calculations can be made for various monitor and TV size displays varying from VGA up to UXGA (1600×1200 pixels) and even QXGA (2048×1536 pixels) resolutions as well as for lower resolutions for mobile phone applications, e.g. 128×128 pixels. In each case, it is observed that the power consumption of the LED die array could be lower than that of conventional AM OLED and AM LCD displays at a given display luminance.

Each LED element or sub-pixel requires a different specific semiconductor stack to generate its specific color. The color generated by a LED element depends on the bandgap energy of the materials in the semiconductor stack. For example, a semiconductor stack of AlGaAs can generate radiation in the red portion of the electromagnetic spectrum, a stack of AlGaInP can generate radiation in the green/amber portion of the spectrum and a stack of AlGaInN can generate radiation in the green/blue portion of the spectrum. Other semiconductor stacks may be available for generating red, green or blue light.

As appreciated by the skilled person, to create a semiconductor stack of an LED element, the semiconductor stack requires a structural correlation between the substrate and the semiconductor stack to be formed, or in other words, requires a given surface condition of a specific substrate on which the semiconductor stack can be formed. For example, the surface condition may relate to an epitaxy (or structural relation) between a semiconductor stack's crystal lattice (spacing and orientation), and the crystal lattice of a specific substrate, in order to create that semiconductor stack with sufficient quality to allow emission of light of a given specific wavelength (when stimulated). Consequently, the substrate on which these different semiconductor stacks can be formed (deposited or grown) may differ from stack to stack and hence from sub-pixel to sub-pixel.

The following is noted. First, as has been described above in more detail, the typical luminance of an LED element is relatively high in comparison with the luminance of an LCD element (of about the same size and including backlight). By relaxing the requirement of the specific substrate with optimal surface conditions to a substrate with less favorable surface conditions to form the semiconductor stack of the LED element, the created semiconductor stack may comprise a crystalline structure with defects. By consequence the LED element formed may have a lesser quality which can result in a decreased luminance in comparison to an LED element with a "perfect" semiconductor stack. However, given the relatively high luminance in comparison with LCD elements, the reduced luminance of an LED element with defects in the semiconductor stack may still be sufficient and acceptable for a display device. Also, a reduction of manufacturing costs may be possible.

Next, if the requirement on the surface condition of the substrate can be relaxed, it is feasible that the LED element of lesser but still acceptable quality of one color type can be formed on another substrate that is specific for a LED element of another color type. For example, a LED element of red color may be formed on another substrate specific to a LED element of either green or blue color.

Possibly, it is required that to form a LED element on a non-specific substrate, a precursor or adhesion layer is to be deposited on the other substrate. In that case, the precursor or adhesion layer provides a usable surface condition upon which to form the LED element. Based on these and/or other recognitions, it is considered that on a given substrate LED elements of various color types can be formed.

Moreover, at least some embodiments of the LED arrays are provided with interconnection circuitry comprising interconnection wiring R1, R2, R3, C1, C2, C3, C4, C5, C6 and (optionally) driving circuitry (row and/or column driving circuitry RD; CD) on the substrate on which the LED elements are formed. For application of the interconnection circuitry, advantageously available (LCD) array plate processing technology can be used.

Furthermore, some embodiments may provide that a plurality of the given substrates on which the LED elements are formed, is attached to or deposited or formed on a carrier of larger area. For example, the substrates may be laminated or deposited or formed on a glass substrate. Typically, a substrate on which LED elements can be created is a monocrystalline wafer which may have a size of 6"(15 cm), 8" (20 cm) or in some cases 12" (30 cm) depending on the specific wafer material. It is observed that production facilities to form LED elements may well be the same as the facilities for producing (portions of) LC Displays. LCD manufacturing substrates (glass plates) may have a typical size (length) up to about 2 m. As described above, one LED element in an LED array may have comparable dimensions as one LCD sub-pixel. Consequently, by attaching the specific substrates on a carrier plate for LCD, it becomes possible to scale up LED array production while forming LED elements of similar size as LCD sub-pixels and forming interconnection wiring on the substrate. After manufacturing the LED elements, the carrier plate can be cut together with the specific substrates to form separate LED arrays.

In this regard, LED elements of different color types can be combined on one specific substrate of one color type by accommodating the surface for the other color types by applying a specific precursor or adhesion layer for each of the other color types.

Optionally as explained above, the substrate does not have to be specific to one color type. Given the relatively high luminance of LED elements, even with a lesser crystalline quality, it may be sufficient that the substrate provides the possibility to form LED elements on it (by relaxing the required structural correlation/surface condition between the crystal lattice of the substrate and the crystal lattice of the semiconductor stack of the LED element to be formed). Therefore, in the following, the substrate will be described as a base substrate, which is either a specific substrate for the crystal lattice of at least one type of semiconductor stack to be grown or a substrate with acceptable structural correlation with the crystal lattice of said at least one type of semiconductor stack to be grown, or a substrate that (on at least a portion of the substrate) comprises a surface layer with characteristics that allow the formation of the semiconductor stack on that surface layer.

Clearly, an LED array can thus be formed by combining the method of using one or more precursor/adhesion layers on which an LED element can be formed and the method of forming a LED element on a base substrate.

Figure 2:
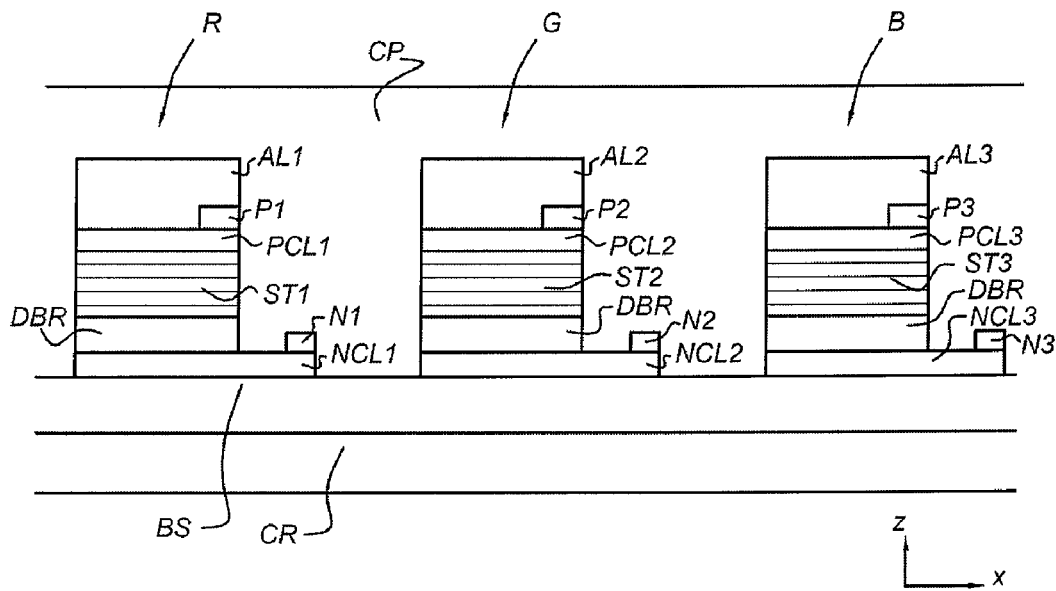
FIG. 2 shows schematically a cross-section of a first embodiment of an LED stack arrangement.

FIG. 2 shows schematically a cross-section of a first embodiment of an LED stack arrangement. The cross-section extends along the horizontal direction X.

A base substrate BS is arranged on a carrier plate CR. The carrier plate CR has the function of being a carrier of the LED array(s) and usually may not have a required surface condition which allows forming a suitable semiconductor stack for each type R, G, B of LED element.

Thus, on top of the carrier plate CR the base substrate is arranged as an interfacial layer for each type of LED element in such a way that the interfacial layer provides substantially the required or acceptable surface condition for a type of LED element. The carrier plate CR may therefore require a treatment in order to be able to carry a base (monocrystalline) substrate BS like silicon (Si), sapphire, silicon-carbide (SiC) or gallium-arsenide (GaAs), depending on the particular semiconductor stack desired for a specific sub-pixel.

In this embodiment, the base substrate BS is attached to the carrier plate CR before the LED semiconductor stacks are grown. The attachment of one or more substrates may take various forms. In one case, a lamination process to provide the base substrate(s) on the carrier plate may be used; in other cases, deposition techniques to form (a) base substrate layer(s) on the carrier plate may be used.

On the base substrate BS, LED elements R, G, B are arranged adjacent to each other. Each LED element R, G, B comprises a negative contact layer NCL1, NCL2, NCL3 on the base substrate BS.

On top of the negative contact layer NCL1, NCL2, NCL3, the respective semiconductor stack ST1, ST2, ST3 is located. Note that the negative contact layer may provide an improved or preferred surface condition for the semiconductor stack.

On the negative contact layer NCL1, NCL2, NCL3, next to the semiconductor stack ST1, ST2, ST3 a negative electrode N1, N2, N3 is arranged. On top of each specific semiconductor stack ST1, ST2, ST3 a positive contact layer PCL1, PCL2, PCL3 is located. Each positive contact layer PCL1, PCL2, PCL3 is connected to a respective positive electrode P1, P2, P3.

Above the positive contact layer PCL1, PCL2, PCL3 and its respective positive electrode P1, P2, P3 a respective adjustment layer AL1, AL2, AL3 may be located depending on the optical characteristics of the respective LED element R, G, B. If present, the adjustment layer AL1, AL2, AL3 is arranged for providing an improvement of the optical characteristics (relating to e.g. output or spectral filtering), of the respective LED element.

The adjustment layer may be used to improve the output direction of the LED element and also the perception of the color of the radiation emitted by the semiconductor stack. The adjustment layer may be arranged for a spectral filtering of the emitted radiation from a less desired color (range) to a more desired color (range), for example, from green/blue to blue. Optionally, the adjustment layer may comprise a phosphorescent material, which transforms the radiation emitted by the semiconductor stack to a different color in accordance with the phosphorescence properties of the phosphorescent material. This allows a (fine-)tuning of the color generated by the respective LED element.

As shown in FIG. 2, between the negative contact layer NCL1, NCL2, NCL3 and the semiconductor stack ST1, ST2, ST3 of the LED element R, G, B a distributed Bragg reflector structure (DBR) is located. The DBR structure is an optional part of the LED element for adjusting the light output direction of the LED element. The DBR layer is arranged to direct the light emitted by the semiconductor stack in substantially one direction. The location of the DBR layer is typically at a side of the semiconductor stack facing away from the intended light output direction. As shown here, the DBR layer may, for example, be located between the negative contact layer and the semiconductor stack but another arrangement of the DBR layer relative to the other layers of the LED element is possible.

On top of the LED element, an overcoat layer CP is provided to protect the respective LED element from the environment and reduce possible corrosion. The overcoat layer CP may comprise one or more sub-layers, such as a diffuser sub-layer for diffusion of light originated by the LED element R, G, B and/or an anti-reflection sub-layer. Other sub-layers that can improve the optical performance of each LED element are also conceivable.

It is noted that each of the LED elements R, G, B is formed by a sequence of semiconductor manufacturing processes. Such semiconductor manufacturing processes comprise the application of a photosensitive layer, the patterning of such a layer by exposure to radiation and subsequent removal of exposed (or not-exposed) material to form a patterned mask layer. Further, the processes may comprise vapor deposition technology (either physical or chemical), and atomic layer growth (for example molecular beam epitaxy). Also, the processes may comprise etching (dry and/or wet) and chemical mechanical polishing. Additionally, the processes may comprise ion-implantation technology.

Each LED element type R, G, B may be fabricated separately from the other LED element types, but some processes may be in common for two or three of the R, G, B LED element types.

In this embodiment, the negative contact layers NCL1, NCL2, NCL3 may each or individually be comprised of a material that provides a preferred or acceptable surface condition for each or one individual semiconductor stack. Possibly, the negative contact layers may comprise the same material if under this condition for each type of semiconductor stack at least an acceptable surface condition is obtained.

The positive contact layers PCL1, PCL2, PCL3 may comprise the same material. Also, the adjustment layers AL1, AL2, AL3 and/or the overcoat layer CP may comprise the same material.

The adjustment layer may be formed on top of the respective LED element by a similar process as the other layers of the LED element or alternatively, by means of, for example, deposition or screen printing.

Figure 3:
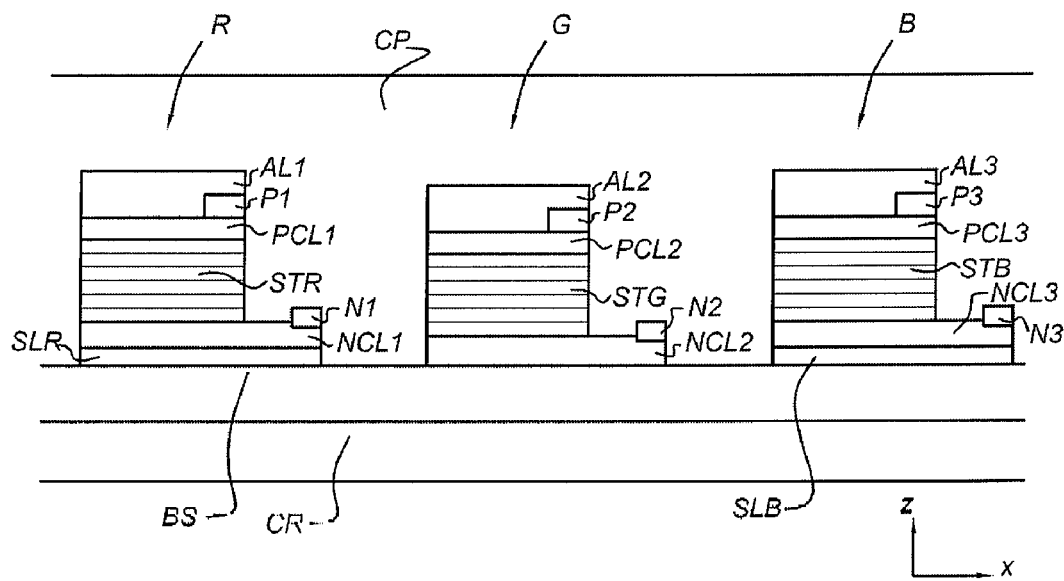
FIG. 3 shows schematically a cross-section of a second embodiment of an LED stack arrangement.

FIG. 3 shows schematically a cross-section of a second embodiment of a LED stack arrangement. In FIG. 3, entities with the same reference number as in the preceding figures refer to the corresponding entities.

In this embodiment, different LED elements (that is, LEDs with different semiconductor stacks) are formed on the base substrate by providing a precursor layer or adhesion layer between the base substrate and the respective semiconductor stack. In the example shown here, the base substrate BS is arranged for accommodating one type of LED element directly on the surface BS by providing a specific or acceptable structural correlation with the crystal lattice of the semiconductor stack. For example, the LED element for the green sub-pixel G is grown/formed directly on the base substrate BS. The base substrate BS may provide the specific or acceptable surface condition that allows formation of the LED element with semiconductor stack STG for the green sub-pixel G directly on the base substrate BS. The base substrate is non-specific for the other semiconductor stacks STR, STB for the red and blue sub-pixel R, B.

To allow formation of the red R and blue B sub-pixels, each by means of the respective semiconductor stack STR, STB for emission of radiation of red and blue color, respectively, a respective precursor/adhesion layer SLR, SLB is formed on the base substrate BS. Typically, the precursor/adhesion layers SLR, SLB are formed by a deposition process.

Likewise, when the base substrate is a specific substrate for the semiconductor stack STR, STB for either the red sub-pixel R or the blue sub-pixel B, the semiconductor stack for the green sub-pixel G would be formed on a precursor/adhesion layer SLG specific for the semiconductor stack STG. The precursor/adhesion layer SLR, SLG, SLB provides a surface condition which allows the formation of the semiconductor stack STR, STG, STB for one sub-pixel R, G, B on a non-specific base substrate BS.

On top of the precursor/adhesion layer, the LED element is then constructed in a substantially similar manner as described above with reference to FIG. 2. It is noted that in the embodiment of FIG. 3, it is conceivable that for an LED element, the order of the precursor/adhesion layer and negative contact layer may be reversed. First, the negative contact layer may be formed and then on top of the negative contact layer the precursor/adhesion layer may be formed.

Figure 4:
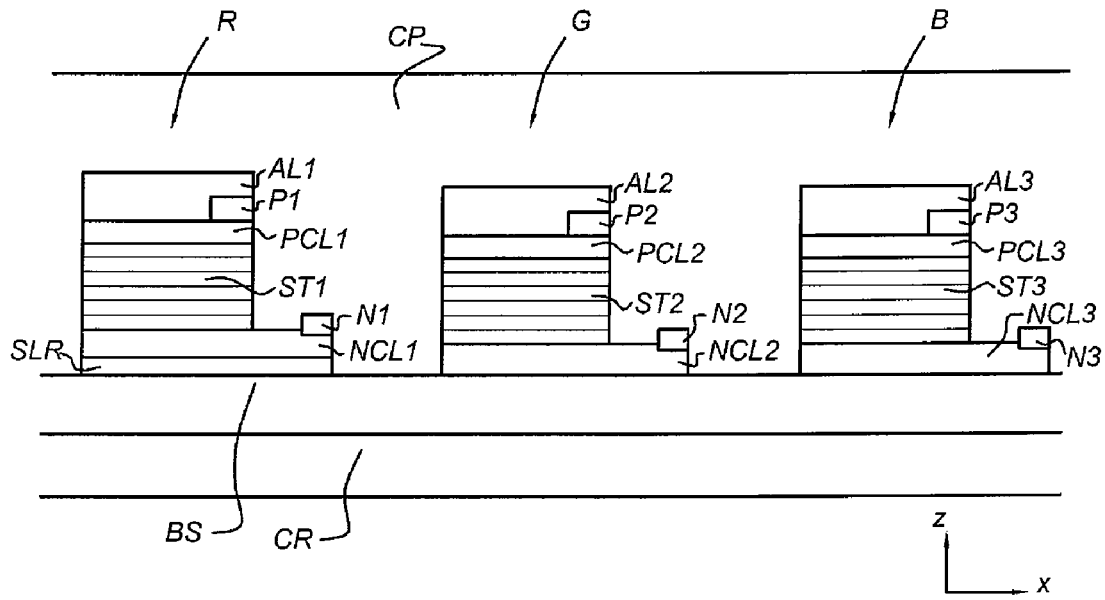
FIG. 4 shows schematically a cross-section of a third embodiment of an LED stack arrangement.

FIG. 4 shows schematically a cross-section of a third embodiment of an LED stack arrangement. In FIG. 4, entities with the same reference numbers as in the preceding figures refer to the corresponding entities.

In this example the LED element for the green sub-pixel G and the LED element for the blue sub-pixel B are formed directly on the base substrate BS. For example, the base substrate BS is specific for the negative contact layer NCL2 and the semiconductor stack ST2 of the green sub-pixel LED element G. The LED element for the green sub-pixel has, for example, an optimal structural correlation with the base substrate BS. The semiconductor stack ST3 of the blue-pixel has a less than optimal match to the base substrate BS, but the light output of the blue-pixel LED element may still be acceptable.

In this embodiment, the LED element for the red sub-pixel cannot be formed on the base substrate due to an unacceptable mismatch to the base substrate. Therefore, a precursor/adhesion layer SLR is provided on the base substrate BS to allow formation of the LED element for the red sub-pixel R.

Figure 5:
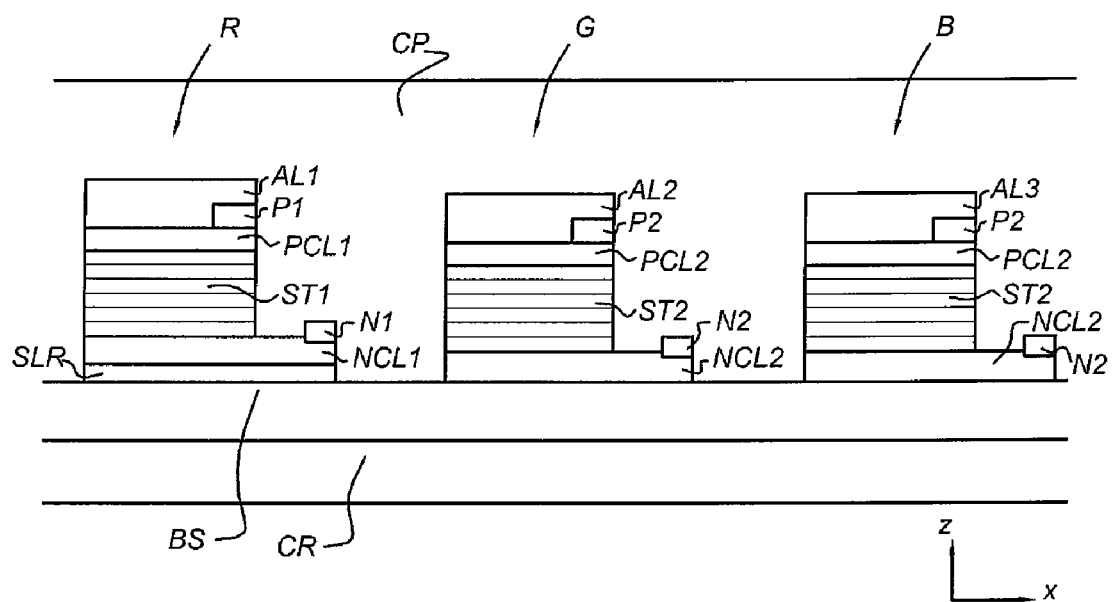
FIG. 5 shows schematically a cross-section of a fourth embodiment of an LED stack arrangement.

FIG. 5 shows schematically a cross-section of a fourth embodiment of an LED stack arrangement. In FIG. 5, entities with the same reference numbers as in the preceding figures refer to the corresponding entities.

In this example, the LED element for the green sub-pixel G and the led element for the blue sub-pixel B are formed directly on the base substrate BS. The LED element for the red sub-pixel R may be the same as shown in FIG. 4.

In this case, the LED elements G, B for the green and blue sub-pixels are constructed in the same manner. The LED elements G, B have some common portions: at least the semiconductor stack ST2, negative contact layer NCL2, positive contact layer PCL2 and electrodes P2, N2 are similar or identical.

Due to the presence of the same semiconductor stack in both LED elements, both LED elements G, B will emit radiation of the same color range, in this example green/blue. To differentiate the two LED elements as sub-pixels with different color, the LED element designated as green sub-pixel G comprises an adjustment layer AL2 to filter the radiation emitted by the semiconductor stack ST2 such that only radiation of green color is emitted. The LED element designated as green sub-pixel B comprises an adjustment layer AL3 to filter the radiation emitted by the semiconductor stack ST2 such that only radiation of blue color is emitted.

It will be appreciated by the skilled person that other combinations of LED elements R, G, B formed directly on the base substrate BS, formed on a precursor/adhesion layer SLR, SLG, SLB and/or formed by using an adjustment layer AL1, AL2, AL3 may be possible.

Figure 6:
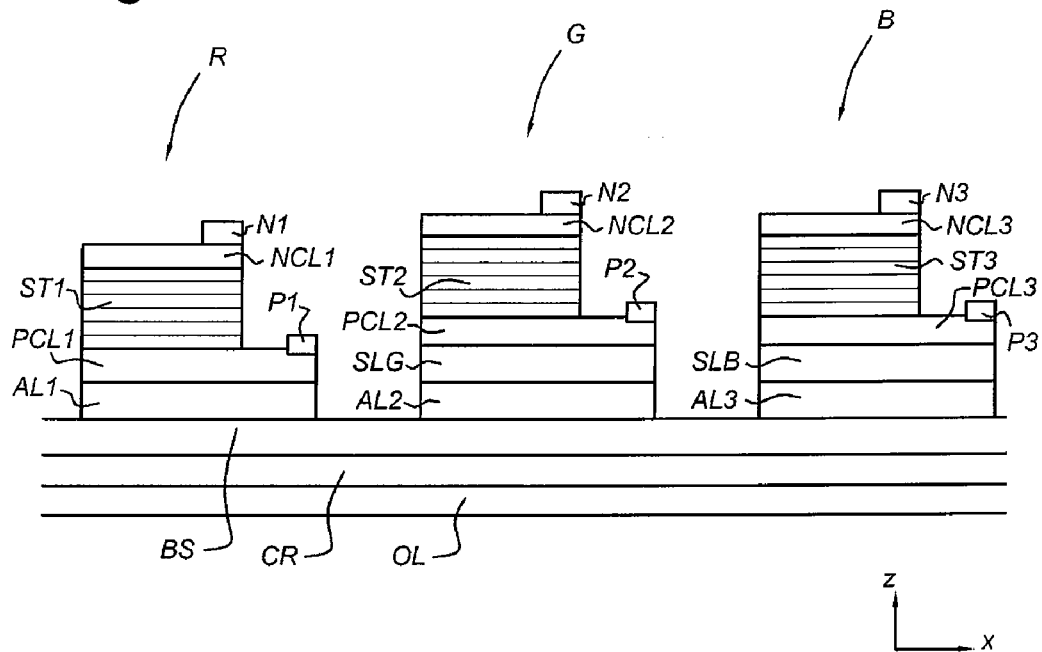
FIG. 6 shows schematically a cross-section of a fifth embodiment of an LED stack arrangement.

FIG. 6 shows schematically a cross-section of a fifth embodiment of an LED stack arrangement. In FIG. 6, entities with the same reference numbers as in the preceding figures refer to the corresponding entities.

It is noted that in case the base substrate BS and the carrier plate CR are both transparent plates, the LED elements R, G, B may be of the bottom emission-type that are arranged for emission at the interface between the LED element and the base substrate. As an advantage, this allows fabrication of an LED array of which the base substrate BS and carrier plate can function as a front screen of the LED array. In the case of bottom emission, the stacking order of the layers forming each LED element is reversed in comparison to the embodiments described above that all relate to top emission.

If present, the adjustment layers AL1, AL2, AL3 can be formed on the base substrate BS. In succession, the positive contact layer and positive electrode, the semiconductor stack, and the negative contact layer/negative electrode are formed on top of the adjustment layer. In one or more of the LED elements, a precursor/adhesion layer can be incorporated for accommodating the layers of the LED element on the base substrate. A DBR structure (not shown here) may be implemented in or near the LED element.

In an alternative embodiment, the side of the carrier plate facing away from the LED element may comprise the adjustment layer and/or an anti-reflection layer and/or any other conceivable optical layers OL. In that case, the positive contact layer and positive electrode are formed on the base substrate (if needed on a precursor/adhesion layer), and in succession, the semiconductor stack, and the negative contact layer/negative electrode are formed on top of the positive contact layer.

Figure 7:
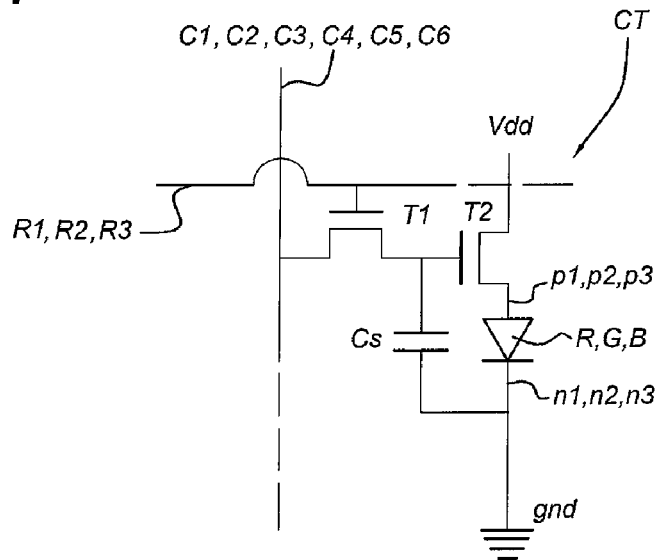
FIG. 7 shows schematically an embodiment of a first circuit to drive an LED element.

FIG. 7 shows a first embodiment of a circuit CT to drive an embodiment of an LED element of an LED array display device. The solid state LED array of FIG. 7 can be driven in various ways.

First, one can use passive matrix (PM) addressing by applying a select pulse at each row at a frequency of, say, 100 Hz. On the column C1, C2, C3, C4, C5, C6, one should supply a current proportional to the desired light output of the pixel under consideration. Once a row R1, R2, R3 is selected, all columns are addressed simultaneously to address all pixels in the selected row. Drawback of this method is the high peak currents required on the column electrodes (or power lines) as each sub-pixel R, G, B is in the "on" state during a very short part of a frame time. This requires either plating of the column electrodes or applying wider (or multiple) electrodes to lower the resistivity. Also, special measures may be required in the driver IC that comprises the row driving circuit RD and the column driving circuit CD. For some cases, however, this passive matrix (PM) addressing may be very attractive from a cost perspective. As the aperture of above described LED array displays may not be critical, enough space may exist for wider electrodes in between individual LED elements. Given best LED efficiencies, one can realize PM addressing up to 2-inch qVGA resolutions, for example, for solid state LED arrays, in contrast to PM OLED displays.

More straightforward may be to use a 'sample and hold' effect as used in conventional AM LCD and AM OLED displays. Using a simple 2-TFT circuit to drive the individual LED element, the current feeding the LED element can be controlled during the whole frame time, thereby significantly reducing the required (peak) currents compared to previously described method. An example of this circuit is given in FIG. 7.

The circuit CT of this embodiment comprises a selection line SEL, a data line DATA and a supply line Vdd, a first transistor T1, a second transistor T2, and a storage capacitor CS. The first and second transistors are typically embodied as thin-film transistors TFTs.

The selection line SEL extends as row line R1, R2, R3 and is coupled to the gate of the first transistor T1. The data line DATA extends as column line C1, C2, C3, C4, C5, C6 and is coupled to a source of the first transistor T1. A drain of the first transistor T1 is coupled to a gate of the second transistor T2 and to a first terminal of the storage capacitor CS.

The supply line Vdd couples to a source of the second transistor T2. A drain of the second transistor T2 is coupled to the positive electrode P1, P2, P3 of the LED element R, G, B.

A second terminal of the storage capacitor CS is coupled to the negative electrode N1, N2, N3 of the LED element and to ground GND.

During use, a gate selection pulse on the SEL line opens TFT T1, enabling a data voltage on the DATA line, of which the voltage level corresponds to the light output of the LED element, to be stored on the storage capacitor CS. The voltage across the storage capacitor CS controls the gate of the second transistor T2 and opens second TFT T2, also after first TFT T1 has closed again. The LED element is driven by the supply line Vdd during the frame time. At the next selection pulse on SEL, a similar or different data voltage (on DATA) may be put on the storage capacitor CS, which may change the LED current correspondingly. A potential drawback of this simple circuit CT is that the LED current and hence the LED light output directly depend on a threshold voltage of the second TFT T2.

To overcome this drawback, various compensation circuits for compensating the threshold voltage of the second transistor T2 exist, such circuits comprise both current-controlled and voltage-controlled compensation circuits. These compensation circuits typically comprise 4 to 6 transistors.

The aperture ratio of a sub-pixel R, G, B is not an issue for an LED array that is an emissive display type. The TFT circuit CT with storage capacitor CS can be placed either adjacent to each individual LED element, or underneath the LED element or partially adjacent and underneath the LED element.

It is noted that the specific luminance of LED elements depends on the quality of the semiconductor stack, which is related to the match between the crystal lattice of the semiconductor stack and that of the specific substrate. Due to the relatively high specific luminance of the LED elements, in comparison to LCD or OLED elements it is conceivable that a specific substrate with an non-optimal match can be used. This obviously reduces the quality of the semiconductor stack formed on the specific substrate and the specific luminance of the semiconductor stack will be reduced accordingly, but in view of the required luminance of the display this may be acceptable. So, a base substrate like a specific (monocrystalline) substrate BS as silicon (Si), sapphire, silicon-carbide (SiC) or gallium-arsenide (GaAs) may be replaced by a less specific crystalline substrate that has some but still acceptable lattice mismatch with the specific semiconductor stack ST1, ST2, ST3 that is grown as a LED element that may emit red, green or blue light. For example, such a non-optimal substrate layer may be Si instead of sapphire or GaAs or may even be an amorphous substrate (layer) like $SiO_2$ glass. In case of a glass plate, the use of a carrier plate may not be required any more. In the latter case of an amorphous base substrate BS the use of a precursor/adhesion layer may be preferable.

The interconnection of the individual LED devices to shared row and column electrodes can be established in several ways. Above, an LED stack arrangement has been described in which the negative electrodes are formed one or more steps prior to the formation step of the positive electrodes. This directs the order of the semiconductor layers and consequently the preferred light output direction (in FIGS. 2 and 3 the preferred light output direction is substantially upward along the Z-direction). In practice, however, one may also reverse the order of the electrodes and semiconductor stacks, and even the position of the single substrate in relation to the position of the base substrate, and hence the preferred light output direction.

Furthermore, an LED array may comprise at least one additional type of sub-pixel LED element next to the types of sub-pixel LEDs that produce radiation of red, green or blue color (RGB display). For example, next to the red, green and blue color LED elements, the LED array may comprise LED elements of a type that produces substantially white radiation (RGBW display).

It is noted that the efficiency of a LED element may differ from one (color) type to another (for example due to the structural relation of the different semiconductor stack types for R, G and B, and the base substrate BS). In that respect, colors generated by a set of sub pixels (RGB or for example RGBW) may suffer from a deviation due to an imbalance of luminance between sub-pixels. To provide a correction, the area size of each LED element can be chosen during manufacturing in accordance with its emission color in such a way that imbalance of luminance between sub-pixels is corrected.

As the above discussion on power requirements shows, an embodiment of LED array can be significantly more efficient than an LCD. This is caused by the fact that there are no absorbing layers like color filters and polarizers in front of the LED's. In fact, the calculation above shows that considerably more light can be produced than is necessary. Such an excessive amount of light has under normal circumstances no advantage. Therefore, the diode area can be made smaller, which may have the following opportunities:

For example, the resolution of the LED array (i.e., the number of LED elements per unit of length) can be increased significantly. Contrary to the increase of resolution in an LCD, there is no aperture limitation involved. The application of an LED array is therefore for high resolutions on small displays much more attractive than the application of LCD.

As another example, the area on the base substrate of the LED array that is not necessary for the light emitting diodes can be used for auxiliary electronic circuitry. This can therefore limit the cost of the display drivers. Examples can be the inclusion of a memory circuit, or a correction circuit for in-homogeneities resulting from e.g. processing (e.g. shift of threshold voltage).

As another example, for low resolution LED array displays, a passive addressing method can be considered with a current limitation in the row and/or column lines. Such a passive addressing can decrease the costs of the display considerably.

As still another example, for (forward) currents in the range of 1 nA up to 1 mA the light output of LEDs can be perfectly linear. As a consequence, the greyscale generation can be much easier than in a non-linear system like LCD. Besides, the number of greyscales can easily be extended, as well as the brightness of the LED array display as a whole.

As yet another example, besides the excellent front-of-screen performance (including the higher saturated color that an LED can generate in comparison with an LCD color element) and relatively lower power consumption, the total display thickness of a display module equipped with an LED array may be significantly smaller than that of conventional display modules. Compared to an AM LCD module, only a single substrate is needed instead of 2 (glass) substrates with a liquid crystal in between. Besides, no backlight system, or any polarizers are required.

It should be emphasized that the above-described embodiments are merely possible examples of implementations set forth for a clear understanding of the principles of the invention. Many variations and modifications may be made to the above-described embodiments without departing substantially from the spirit and principles of the invention. All such modifications and variations are intended to be included herein within the scope of this disclosure and the present invention and protected by the following claims.

The invention claimed is:

1. An LED array comprising:
   a base substrate (BS) and a plurality of light emitting diodes, each of the light emitting diodes comprising a stack of a first contact layer, a semiconductor stack and a second contact layer,
   the semiconductor stack being on top of the first contact layer, the second contact layer being on top of the semiconductor stack; the plurality of light emitting diodes being arranged in pixel matrix on the base substrate as LEDs of at least three types (R, G, B); the LEDs according to their type (R, G, B) being arranged as at least a first, second and third sub-pixel in the pixel matrix for emission of radiation of a respective specific at least first, second and third color,
   precursor/adhesion layers on the base substrate;
   light emitting diodes of at least one type of the at least three types of LEDs being directly on the base substrate, and light emitting diodes of other type(s) of the at least three types of LEDs being arranged on the precursor/adhesion layers respectively;
   interconnection circuitry on the substrate, operative to connect to the light emitting diodes of the array for addressing each of the light emitting diodes; and
   an overcoat layer covering the plurality of light emitting diodes and filling gaps between the plurality of light emitting diodes.

2. LED array according to claim 1, wherein the precursor/adhesion layers are provided with characteristics that allow the formation of the light emitting diodes of said other type(s) of the at least one type of LEDs on the base substrate.

3. LED array according to claim 1, wherein the base substrate is attached to a carrier plate; the base substrate and carrier plate forming an assembly.

4. LED array according to claim 1, wherein the light emitting diodes of the at least one of the at least three types of LEDs are arranged with the first contact layer directly on the base substrate.

5. LED array according to claim 1, wherein each of the precursor/adhesion layers is disposed between the first contact layer and the base substrate.

6. LED array according to claim 1, wherein a light emitting diode comprises an adjustment layer on the second contact layer, the second contact layer being on a light output side of the light emitting diode, the adjustment layer being arranged for adjusting light output characteristics of the light emitting diode.

7. LED array according to claim 6, wherein the adjustment layer comprises a phosphorescent layer.

8. LED array according to claim 1, wherein the first contact layer is a negative contact layer and the second contact layer is a positive contact layer.

* * * * *